United States Patent [19]
Schweighofer

[11] Patent Number: 5,991,179
[45] Date of Patent: Nov. 23, 1999

[54] POWER AMPLIFIER WITH MULTIPLE, SWITCHED OUTPUT STAGES, AND METHOD AND DRIVER FOR DRIVING THE OUTPUT STAGES USING DIFFERENT PATTERN SIGNALS GROUPS

[75] Inventor: Peter Schweighofer, Nuermberg, Germany

[73] Assignee: Siemens Aktiengesellschaft, Munich, Germany

[21] Appl. No.: 09/032,756

[22] Filed: Feb. 27, 1998

[30] Foreign Application Priority Data

Mar. 10, 1997 [DE] Germany .......................... 197 09 767

[51] Int. Cl.$^6$ ................................................. H02M 7/00
[52] U.S. Cl. ............................................... 363/71; 307/82
[58] Field of Search ........................... 307/82, 77; 363/71

[56] References Cited

U.S. PATENT DOCUMENTS

| | | | |
|---|---|---|---|
| 3,581,212 | 5/1971 | Mcmurray | 327/105 |
| 3,867,643 | 2/1975 | Baker et al. | 327/105 |
| 5,546,299 | 8/1996 | Lenz | 363/71 |

Primary Examiner—Shawn Riley
Attorney, Agent, or Firm—Hill & Simpson

[57] ABSTRACT

In a power amplifier having multiple, switched output stages and a driver, and method for driving the switched output stages, a number of drive signal groups are generated for respectively driving the switched output stages. A number of pattern signal groups are generated dependent on at least one input signal, and drive signal groups are generated from the pattern signal groups, with each pattern signal group being allocated respectively to one of the switched output stages, and this allocation is changed in segments. A good load balancing between the individual switched output stages is achieved with a low circuit-oriented outlay.

31 Claims, 2 Drawing Sheets

POWER AMPLIFIER WITH MULTIPLE, SWITCHED OUTPUT STAGES, AND METHOD AND DRIVER FOR DRIVING THE OUTPUT STAGES USING DIFFERENT PATTERN SIGNALS GROUPS

BACKGROUND OF THE INVENTION

1. Field of the Invention

The present invention is directed to a power amplifier of the type having multiple, switched output stages and containing a driver which operates the output stages. The present invention is also directed to the driver for such a power amplifier, and a method for operating such a power amplifier. The invention is preferably utilized in a gradient amplifier of a nuclear magnetic resonance tomography apparatus that has a number of series-connected switched output stages for driving of a gradient coil.

2. Description of the Prior Art

German OS 43 04 517, corresponding to U.S. Pat. No. 5,546,299, discloses a power supply for an inductive load wherein two switched output stages are connected in series at the output side. A control arrangement composed of two control modules generates drive signals for active switch elements of the output stages.

During operation, the output stages apply a voltage of several hundred Volts to the gradient coil in order to periodically build up and dismantle an exactly regulated current of, for example, 300 A. Given a number of coupled output stages, operating conditions are possible wherein an energy transfer occurs between the output stages.

When, for example, the predetermined shape of the current curve exhibits steep leading edges and flatter trailing edges and the output stages assume the functions of a basic output stage and a peak load output stage, it can occur that the peak load output stage is cut in only during the steep leading edges of the current. The energy output from the peak load output stage to the gradient coil is then exclusively returned to the basic load output stage during the flatter trailing current edges. This can lead to an excessive charging (over-voltage) of a charging capacitor in the basic load output stage, and thus can result in an impaired function of or damage to the gradient amplifier.

Such an undesired charging of an output stage is also possible when the output stages are differently driven (for example, supply output voltages of differing polarity), when they exhibit different properties (for example, with respect to clock frequency or intermediate circuit voltage) or when a component known as a booster is connected into the load circuit.

In order to avoid over-voltages, German OS 43 04 517 and U.S. Pat. No. 5,546,299 teach the use of discharge resistors as a first alternative, that are connected in parallel with the charging capacitors. The presence of such discharge resistors, however, causes the energy consumption to be increased and the waste heat of the output stages to be eliminated with a cooling arrangement is considerable. As a second alternative, these corresponding documents teach the use of switchable discharge devices (DC—DC converters) for effecting the energy distribution between the output stages. Such discharge devices, however, are complicated in terms of realization, particularly when more than two output stages are provided.

SUMMARY OF THE INVENTION

An object of the present invention is to provide a power amplifier with multiple, switched output stages and having a driver circuit, and a method for operating the power amplifier, which avoid the aforementioned problems. In particular, avoidance of a non-uniform loading of the output stages due to fed-back energy or other effects is intended.

The above object is achieved in a power amplifier having multiple, switched output stages and a driver circuit therefor, and a method for operating the power amplifier, wherein a number of drive signal groups for respectively driving the switched output stages are generated from a plurality of pattern signal groups, the pattern signal groups being, in turn, dependent on at least one input signal to the driver circuit. Each pattern signal group is allocated to one of the switched output stages, and this allocation is changed by the drive signal groups in segments.

A "signal group" is typically understood as meaning a number of combined signals; in the extreme case, however, a signal group can be composed of a single signal.

The invention has its basis in changing the roles of the participating switched output stages in certain relatively short time intervals. A good distribution of the fedback energy to all output stages is thereby achieved without special discharge or energy distribution devices being required. The circuit-oriented outlay for the inventive solution is extremely slight.

The invention can be utilized for all types of power amplifiers with a number of output stages, however, a pre-condition is that a change of the roles of these output stages is possible. In the control case, this means that the output stages are coupled on some way or other; in particular, they are connected in series at the output side. Moreover, the output stages must exhibit adequately similar electrical properties, so that each output stage can replace every other output stage whose role it may possibly have to assume.

The invention can also be utilized for power amplifiers wherein no charge transfer ensues between the output stages, for whatever reasons. Unequal loads of the output stages can also occur given such amplifiers, for example when the output stages are differently driven. For example, when one output stage switches more often than another, then higher switching losses occur at the output stage that switches more often. The load differences caused as a result are typically smaller than given a power feedback. Nonetheless, it can be worthwhile to also utilize the invention under such circumstances because the required circuit-oriented outlay is slight.

The invention provides a segment-by-segment variation of the allocation of pattern or model signal groups to the output stages. As used herein, "segment-by-segment variation" means that time segments are provided during which the allocation remains constant. The allocation is varied or changed only between two successive time segments. The time segments need not be permanently prescribed or of equal length. With respect to their duration, the time segments preferably correspond to a switching clock of the driver. This relatively short duration prevents fluctuations in the change of allocation that can be caused by variations within tolerances arising during manufacturing from being visible in a tomogram (if the invention is used in a gradient amplifier of an MRI apparatus) as low-frequency, image-affecting disturbances.

The change in allocation preferably ensues only when the pattern signal groups which will be affected by the change are compatible with one another, so that no disturbances due to the change occur. Two pattern signal groups are considered compatible when the paired pattern signals in these respective groups represent the same switch condition at the point in time of the change of allocation. No additional switching events in the switched output stages are then required for the change.

The point in time of the allocation change is preferably synchronized with the switching clock of the driver. The allocation change is preferably merely enabled by the system clock. The actual change occurs after the enabling only as soon as the aforementioned compatibility condition is met. As an alternative, a suitable time pattern can assure that the allocation change is always possible at predetermined points in time. The compatibility condition then need not be additionally checked then.

Preferably, every variation of the allocation is a permutation, i.e. a modification, that can be considered as a sequence of paired transpositions. Given an amplifier with two output stages, each allocation change then corresponds to an interchange of the signal groups. A cyclical sequence of allocation changes is preferably employed given an amplifier with more than two output stages, so that every possible combination is executed during a complete cycle of allocations. Preferably, only one respective pair of signal groups is interchanged between successive changes.

The pattern signals preferably represent switching sequences, i.e. signals with which the output stages can be directly driven. These switching sequences are preferably fashioned such that the desired output voltages and currents could be generated with them if the load of the output stages did not have to be taken into consideration. Only possibly unequal loads of the output stages thus are compensated by the change in allocation, preferably without modifying the voltage and current curves generated overall (given series-connected output stages). The allocation changes can ensue independently of or dependent on the momentary load of the output stages (in particular, the charge condition of a respectively charging capacitor).

An "allocation" of a pattern signal group to an output stage means that this pattern signal is forwarded unmodified to this output stage as a drive signal group. The required switching events can be especially simply implemented by a digital circuit, with when the pattern signals and/or the drive signals being digital signals.

The inventive goal can also be achieved by a segmented modification (modification in segments) of the allocation of reference signals (input signals) of the power amplifier to the output stages. This solution, however, has the disadvantage of requiring analog switches for the input signals of producing input signals that are more or less chopped and thus they may exhibit discontinuous modifications.

The inventive method can be implemented by a driver having a signal-generating stage wherein the pattern signal groups are generated and having a switching stage for the allocation of the pattern signal groups to the switched output stages and for the segment-by-segment change of the allocation. Alternatively, the invention can also be implemented with a driver wherein the change in allocation is already taken into consideration in the generation of the drive signal groups. In particular, this can be the case given a program-controlled driver. The switching stage can be constructed as hardware, or the function of a switching stage implemented alternatively can be realized by software.

The inventive power amplifier can have two, three or more switched output stages connected in series at the output side and is used with a suitable driver.

DESCRIPTION OF THE PREFERRED EMBODIMENTS

Figure 1:
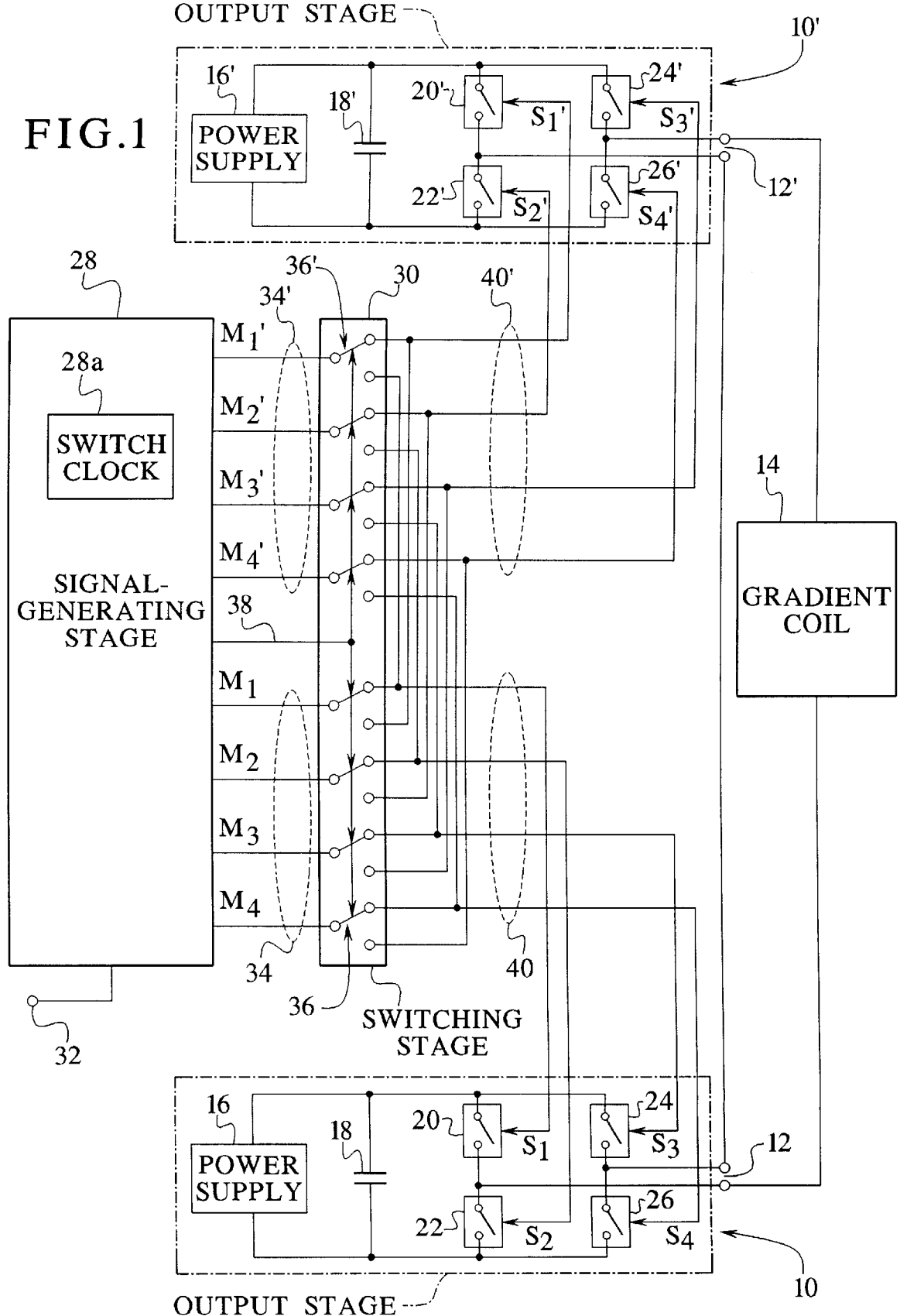
FIG. 1 is a block circuit diagram of components of a gradient amplifier with a connected gradient coil, and having a driver circuit, constructed and operating in accordance with the invention.

The inventors currently consider the gradient amplifier (power amplifier) shown in FIG. 1 to be the best mode of the invention. The gradient amplifier has two substantially identical switched output stages 10, 10' whose outputs 12, 12' are connected in series and are connected to an inductive load, here a gradient coil 14.

A power supply 16 that supplies an output voltage buffered by a charging capacitor 18 is provided for the switched output stage 10. Four active switch elements 20, 22, 24, 26 that, for example, can be FET transistors, are series-connected in respective pairs and connected to the power supply 16 and to the charging capacitor 18. The switch elements 20, 22, 24 and 26 form a full-bridge circuit with which the output voltage of the power supply 16 can be applied with changing polarity to the outputs 12 of the switched output stage 10. Suitable unbiased diodes can alternatively be employed for the switch elements 20, 22, 24, 26.

The switched output stage 10' is constructed with a power supply 16', a charging capacitor 18' and four active switch elements 20', 22', 24', 26' just like the switched output stage 10.

A driver serving to drive the two switched output stages 10, 10' includes a signal-generating stage 28 and a switching stage 30. An input signal input 32 of the signal-generating stage 28 receives an input signal that indicates the desired output voltage sum of the two series-connected output stages 10, 10'. In alternative embodiments, a plurality of input signals, particularly separate input signals for each output stage 10, 10', can be provided. The input signal/signals can also represent other parameters, for example a reference current through the load 14.

Employing pulse-width modulation, for example, the signal-generating stage 28 produces two pattern signal groups M, M' from the input signal in a known way (see the aforementioned 43 04 517, and U.S. Pat. No. 5,546,299 FIGS. 5 through 7), the pattern signal groups M, M' having four clocked pattern signals $M_1$, $M_2$, $M_3$, $M_4$ or $M_1'$, $M_2'$, $M_3'$, $M_4'$, respectively. These pattern signals are switch sequences or switch signals for the active switch elements 20, 22, 24, 26 and 20', 22', 24', 26', respectively. If no value were attached to a load balancing between the output stages 10, 10', the pattern signals $M_1$, $M_2$, $M_3$, $M_4$ or $M_1'$, $M_2'$, $M_3'$, $M_4'$ (in this sequence) could be directly employed for driving the switch elements 20, 22, 24, 26 and 20', 22', 24', 26', respectively.

In the circuit shown in FIG. 1, however, the pattern signal groups M, M' are supplied to the switching stage 30 via respective pattern signal connections 34, 34', each of which has four lines.

The switching stage 30 is formed as a digital circuit of logic gates in order to provide the function of two 4-pole electronic switches 36, 36'(i.e., each switch 36 and 36 40 is a 4-pole switch). The switches 36, 36' only have to transmit signals in the direction from the signal-generating stage 28 to the output stages 10, 10'. A switch signal applied to the switching stage 30 via a switch signal line 38 serves as a common drive of the two switches 36, 36'.

The output stages 10, 10' are connected to the two switches 36, 36' via respective drive connections 40, 40'. The drive connection 40 contains four lines in order to apply drive signals $S_1$, $S_2$, $S_3$, $S_4$ that form a drive signal group S to drive inputs of the switch elements 20, 22, 24, 26. Correspondingly, four lines of the drive connection 40' serve for the transmission of drive signals $S_1'$, $S_2'$, $S_3'$, $S_4'$ of a drive signal group S' to the drive inputs of the switch elements 20', 22', 24', 26'.

The drive connections 40, 40' are connected to the two switches 36, 36' so that, in the switch position (switch state 1) indicated in FIG. 1, the signals of the pattern signal group M arriving via the pattern signal connection 34 are directly forwarded to the drive connection 40 as signals of the drive signal group S. Correspondingly, signals of the pattern signal group M' are forwarded to the drive connection 40' as drive signal group S'. In the other switch position of the switches 36, 36' (switch state 2), this allocation is interchanged, so that the signals of the pattern signal group M are applied to the drive connection 40' and those of the pattern signal group M' are applied to the drive connection 40. The following table shows an overview of the allocation of the pattern to the drive signals in the two switch conditions:

| Allocation | $M_1$ | $M_2$ | $M_3$ | $M_4$ | $M_1'$ | $M_2'$ | $M_3'$ | $M_4'$ |
| --- | --- | --- | --- | --- | --- | --- | --- | --- |
| Switch condition 1 | $S_1$ | $S_2$ | $S_3$ | $S_4$ | $S_1'$ | $2_2'$ | $S_3'$ | $S_4'$ |
| Switch condition 2 | $S_1'$ | $2_2'$ | $S_3'$ | $S_4'$ | $S_1$ | $S_2$ | $S_3$ | $S_4$ |

Figure 2A:
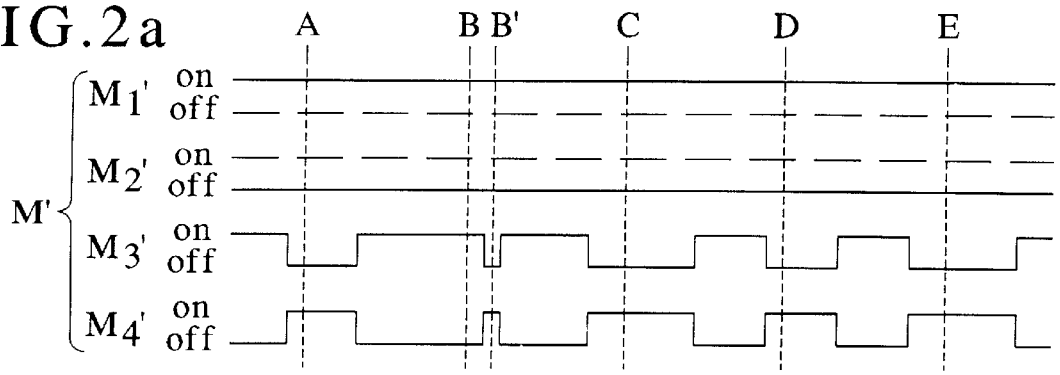
FIGS. 2a–2d respectively show time diagrams of pattern and drive signals for operating the gradient amplifier of FIG. 1.
Figure 2B:
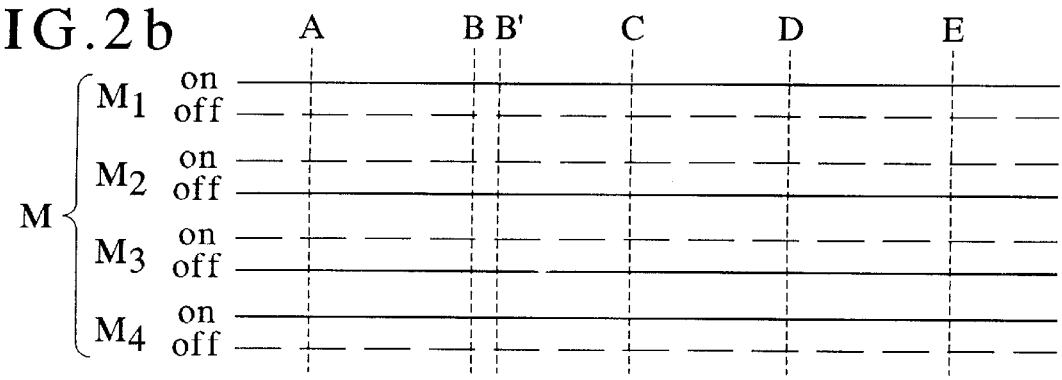

FIG. 2a and FIG. 2b show the pattern signal groups M, M' generated by the signal-generating stage 28 during operation of the gradient amplifier. The pattern signal groups M, M' are formed so that they would be suitable for the direct drive of a basic load output stage and of a peak load output stage. The pattern signal group M thereby represents a maximum drive condition (full drive), whereas the pattern signal group M' achieves a switched operation of the respectively allocated output stage. A signal from a switch clock 28a is employed in the pulse-width modulation, the nature of which can be seen from the pattern signals $M_3'$ and $M_4'$. This switch clock 28a emits a clock signal at 50 kHz in the exemplary embodiment described herein.

The signal generating stage 28 also generates the switch signal transmitted via the switch signal line 36 with which the switching stage 30 is switched back and forth between the switch states 1 and 2. The switching event is enabled by the clock signal from the switch clock 28a at the times A, B, C, D, E shown in FIG. 2a through FIG. 2d. These times are synchronized with the clock signal; however, they exhibit a time offset relative to the middles of the switch pulses in the pattern signals $M_3'$ and $M_4'$. Given a clock signal of 50 kHz, the times A, B, C, D, E limit successive time segments each lasting 20 μs.

A switchover event enabled at times A, B, C, D, E is implemented as soon as the pattern signals $M_1$, $M_2$, $M_3$, $M_4$ coincide in pairs with the pattern signals $M_1'$, $M_2'$, $M_3'$, $M_4'$. This is the case at times A, C, D, E in FIG. 2a and FIG. 2b. Switching between the switch states is immediately carried out at those times. At time B, however, the value of the pattern signal $M_3$ does not coincide with the value of the pattern signal $M_3'$, and the pattern signals $M_4$ and $M_4'$ likewise deviate from one another. In order to assure that no additional switching events or voltage spikes are caused in the output stages 10, 10' due to the switchover event, the switchover time is postponed until coincidence of the pattern signal groups occurs. This is the case at time B' in FIG. 2a and FIG. 2b. The switchover event does not occur until this time. In the extreme case, a intended switchover event can be entirely eliminated if no suitable coincidence of the pattern signal groups M, M' occurs during the switch clock duration.

Figure 2C:
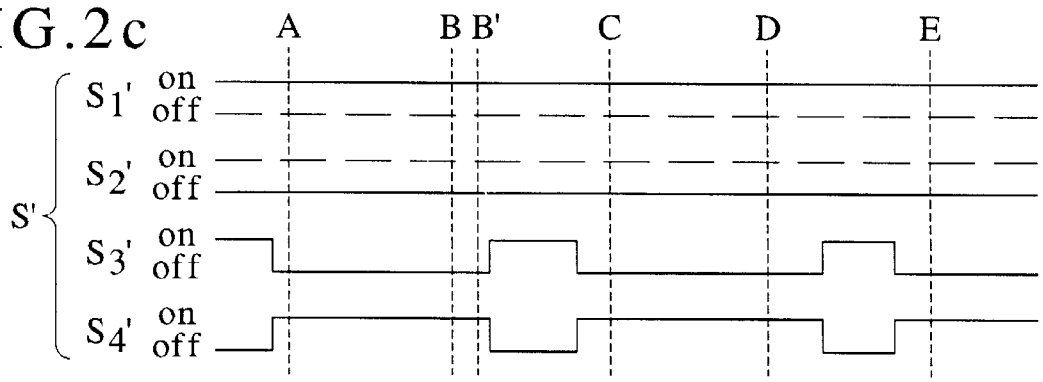
Figure 2D:
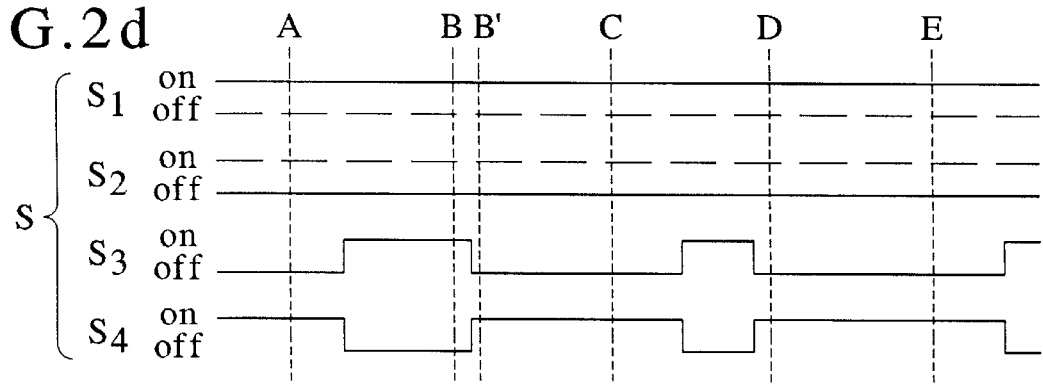

FIG. 2c and FIG. 2d show the drive signal groups S, S' generated by the periodic switchover of the pattern signal groups M, M'. The switching stage 30 is in switch state 1 before time A, during the time segment B'–C and in the time segment D–E. The allocation of the pattern signal groups M, M' to the switch signal groups S, S' is interchanged (switch state 2) in the time segment A–B', in the time segment C–D and after the time E. As proceeds from FIGS. 2c and 2d, the output stages 10, 10' are loaded substantially the same given a drive by the switch signal groups S, S'. During the switch state 1, the output stage 10 operates as a basic load output stage in full drive (the switch elements 20 and 26 are continuously through-connected) and the output stage 10' operates as a peak load output stage. This allocation is reversed during the switch state 2.

The gradient amplifier shown in FIG. 1 has two switched output stages 10, 10'. In alternative embodiments, more than two output stages and a corresponding number of pattern and drive signal groups can also be provided. In one alternative embodiment, for example, the gradient amplifier can have three switched output stages, three pattern signal groups M, M', M" and three drive signal groups S, S', S". The following sequence of six switch conditions is then provided here, this sequence being cyclically run:

| Allocation | M | M' | M" |
| --- | --- | --- | --- |
| Switch condition 1 | S | S' | S" |
| Switch condition 2 | S' | S | S" |
| Switch condition 3 | S" | S | S' |
| Switch condition 4 | S | S' | S' |
| Switch condition 5 | S' | S" | S |
| Switch condition 6 | S" | S' | S |

Given this sequence, only a single transposition in the allocation is undertaken at each change in switch condition. The agreement of the pattern signal groups therefore only has to be checked for the two groups affected by the transposition.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a power amplifier having a plurality of switched output stages, comprising the steps of:

providing at least one input signal to said power amplifier and generating a plurality of pattern signal groups dependent on said at least one input signal, said plurality of pattern signal groups being equal to the plurality of output stages;

generating a plurality of drive signal groups from said pattern signal groups by initially allocating said pattern signal groups respectively to said output stages and changing the allocation of the respective pattern signal groups to the respective output stages in segments by identifying times at which pattern signal groups which will be affected by the change in allocation are compatible with each other and chancing the allocation only at said times; and respectively driving the plurality of output stages with the plurality of drive signal groups.

2. A method as claimed in claim 1 wherein each pattern signal group comprises a plurality of individual pattern signals, and comprising the additional step of identifying said pattern signal groups as being compatible when pairs of the respective individual pattern signals in the pattern signal groups affected by the change in allocation have coinciding values at said times.

3. A method as claimed in claim 1 comprising the additional steps of:
defining said times synchronously with a switching clock; and
if the pattern signal groups which will be affected by said change in allocation are not compatible at a time defined by said switching clock, delaying a change in allocation until the pattern signal groups which will be affected by said change in allocation are compatible.

4. A method as claimed in claim 1 wherein the step of changing the allocation in segments comprises, upon each allocation change, permutating said allocation of said pattern signal groups respectively to said output stages.

5. A method for operating a power amplifier having two switched output stages, comprising the steps of:
providing at least one input signal to said power amplifier and generating two pattern signal groups dependent on said at least one input signal, said plurality of pattern signal groups being equal to the plurality of output stages;
generating a plurality of drive signal groups from said pattern signal groups by initially allocating said pattern signal groups respectively to said output stages and changing the allocation of the respective pattern signal groups to the respective output stages in segments by successively interchanging the allocation of said two pattern signal groups to said two output stages; and
respectively driving the plurality of output stages with the plurality of drive signal groups.

6. A method for operating a power amplifier having three switched output stages, comprising the steps of:
providing at least one input signal to said power amplifier and generating three pattern signal groups dependent on said at least one input signal, said plurality of pattern signal groups being equal to the plurality of output stages;
generating a plurality of drive signal groups from said pattern signal groups by initially allocating said pattern signal groups respectively to said output stages and changing the allocation of the respective pattern signal groups to the respective output stages in segments by changing an allocation of one of said three pattern signal groups to one of said three switched output stages at each allocation change; and
respectively driving the plurality of output stages with the plurality of drive signal groups.

7. A method for operating a power amplifier having a plurality of switched output stages comprising the steps of:
providing at least one input signal to said power amplifier and generating a plurality of pattern signal groups dependent on said at least one input signal, said plurality of pattern signal groups being equal to the plurality of output stages;
generating a plurality of drive signal groups, each comprising a plurality of drive signals, from said pattern signal groups by initially allocating said pattern signal groups respectively to said output stages and changing the allocation of the respective pattern signal groups to the respective output stages in segments; and
respectively driving the plurality of output stages with the plurality of drive signal groups by employing said drive signals to activate switch elements within the respective output stages.

8. A method for operating a power amplifier having a plurality of switched output stages, comprising the steps of:
providing at least one input signal to said power amplifier and generating a plurality of pattern signal groups dependent on said at least one input signal, said plurality of pattern signal groups being equal to the plurality of output stages;
generating a plurality of drive signal groups from said pattern signal groups by initially allocating said pattern signal groups respectively to said output stages and changing the allocation of the respective pattern signal groups to the respective output stages in segments and uniquely generating one of said drive signal groups from only one of said pattern signal groups so that, between the changes in allocation, each pattern signal group has a drive signal curve which agrees with a signal curve of only one drive signal group; and
respectively driving the plurality of output stages with the plurality of drive signal groups.

9. A method as claimed in claim 1 wherein each of said pattern signal groups comprises a plurality of pattern signals, and wherein each pattern signal in said plurality of pattern signals is a digital signal.

10. A method as claimed in claim 1 wherein each of said drive signal groups comprises a plurality of drive signals, and wherein each drive signal in said plurality of drive signals is a digital signal.

11. A method as claimed in claim 1 wherein each of said pattern signal groups comprises a plurality of pattern signals and wherein each of said drive signal groups comprises a plurality of drive signals, and wherein each pattern signal in said plurality of pattern signals is a digital signal and wherein each drive signal in said plurality of drive signals is a digital signal.

12. A power amplifier comprising:
a plurality of switched output stages;
means responsive to at least one input signal for generating a plurality of pattern signal groups dependent on said at least one input signal, said plurality of pattern signal groups being equal to the plurality of output stages;
means for generating a plurality of drive signal groups from said pattern signal groups by initially allocating said pattern signal groups respectively to said output stages and changing the allocation of the respective pattern signal groups to the respective output stages in segments; and
means for driving the plurality of output stages with the plurality of drive signal groups.

13. A drive circuit for operating a power amplifier having a plurality of switched output stages, comprising:
means responsive to at least one input signal for generating a plurality of pattern signal groups dependent on said at least one input signal, said plurality of pattern signal groups being equal to the plurality of output stages; and
means for generating a plurality of drive signal groups from said pattern signal groups to drive said output stages by initially allocating said pattern signal groups respectively to said output stages and changing the allocation of the respective pattern signal groups to the respective output stages in segments.

14. A method as claimed in claim 6 wherein each pattern signal group comprises a plurality of individual pattern signals, and comprising the additional step of identifying said pattern signal groups as being compatible when pairs of the respective individual pattern signals in the pattern signal groups affected by the change in allocation have coinciding values at said times.

15. A method as claimed in claim 5 comprising the additional steps of:

defining said times synchronously with a switching clock; and if the pattern signal groups which will be affected by said change in allocation are not compatible at a time defined by said switching clock, delaying a change in allocation until the pattern signal groups which will be affected by said change in allocation are compatible.

16. A method as claimed in claim 5 wherein each of said pattern signal groups comprises a plurality of pattern signals, and wherein each pattern signal in said plurality of pattern signals is a digital signal.

17. A method as claimed in claim 5 wherein each of said drive signal groups comprises a plurality of drive signals, and wherein each drive signal in said plurality of drive signals is a digital signal.

18. A method as claimed in claim 5 wherein each of said pattern signal groups comprises a plurality of pattern signals and wherein each of said drive signal groups comprises a plurality of drive signals, and wherein each pattern signal in said plurality of pattern signals is a digital signal and wherein each drive signal in said plurality of drive signals is a digital signal.

19. A method as claimed in claim 6 wherein each pattern signal group comprises a plurality of individual pattern signals, and comprising the additional step of identifying said pattern signal groups as being compatible when pairs of the respective individual pattern signals in the pattern signal groups affected by the change in allocation have coinciding values at said times.

20. A method as claimed in claim 6 comprising the additional steps of:

defining said times synchronously with a switching clock; and if the pattern signal groups which will be affected by said change in allocation are not compatible at a time defined by said switching clock, delaying a change in allocation until the pattern signal groups which will be affected by said change in allocation are compatible.

21. A method as claimed in claim 6 wherein each of said pattern signal groups comprises a plurality of pattern signals, and wherein each pattern signal in said plurality of pattern signals is a digital signal.

22. A method as claimed in claim 6 wherein each of said drive signal groups comprises a plurality of drive signals, and wherein each drive signal in said plurality of drive signals is a digital signal.

23. A method as claimed in claim 6 wherein each of said pattern signal groups comprises a plurality of pattern signals and wherein each of said drive signal groups comprises a plurality of drive signals, and wherein each pattern signal in said plurality of pattern signals is a digital signal and wherein each drive signal in said plurality of drive signals is a digital signal.

24. A method as claimed in claim 7 wherein each pattern signal group comprises a plurality of individual pattern signals, and comprising the additional step of identifying said pattern signal groups as being compatible when pairs of the respective individual pattern signals in the pattern signal groups affected by the change in allocation have coinciding values at said times.

25. A method as claimed in claim 7 comprising the additional steps of:

defining said times synchronously with a switching clock; and if the pattern signal groups which will be affected by said change in allocation are not compatible at a time defined by said switching clock, delaying a change in allocation until the pattern signal groups which will be affected by said change in allocation are compatible.

26. A method as claimed in claim 7 wherein each of said pattern signal groups comprises a plurality of pattern signals, and wherein each pattern signal in said plurality of pattern signals is a digital signal.

27. A method as claimed in claim 8 wherein each pattern signal group comprises a plurality of individual pattern signals, and comprising the additional step of identifying said pattern signal groups as being compatible when pairs of the respective individual pattern signals in the pattern signal groups affected by the change in allocation have coinciding values at said times.

28. A method as claimed in claim 8 comprising the additional steps of:

defining said times synchronously with a switching clock; and if the pattern signal groups which will be affected by said change in allocation are not compatible at a time defined by said switching clock, delaying a change in allocation until the pattern signal groups which will be affected by said change in allocation are compatible.

29. A method as claimed in claim 8 wherein each of said pattern signal groups comprises a plurality of pattern signals, and wherein each pattern signal in said plurality of pattern signals is a digital signal.

30. A method as claimed in claim 8 wherein each of said drive signal groups comprises a plurality of drive signals, and wherein each drive signal in said plurality of drive signals is a digital signal.

31. A method as claimed in claim 8 wherein each of said pattern signal groups comprises a plurality of pattern signals and wherein each of said drive signal groups comprises a plurality of drive signals, and wherein each pattern signal in said plurality of pattern signals is a digital signal and wherein each drive signal in said plurality of drive signals is a digital signal.

* * * * *